US006580762B1

United States Patent
Tsumura

(10) Patent No.: US 6,580,762 B1
(45) Date of Patent: Jun. 17, 2003

(54) RATE MATCHING METHOD

(75) Inventor: Soichi Tsumura, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/431,422

(22) Filed: Nov. 1, 1999

(30) Foreign Application Priority Data

| Nov. 2, 1998 | (JP) | 10-311901 |
| Nov. 2, 1998 | (JP) | 10-311902 |
| Oct. 29, 1999 | (JP) | 11-309578 |

(51) Int. Cl.[7] ............................................. H04L 27/04
(52) U.S. Cl. ..................... 375/295; 375/262; 375/265; 375/316; 714/794; 714/795
(58) Field of Search ................................ 375/259, 262, 375/265, 295, 316, 341, 10; 341/51, 61, 792; 714/794, 795; 370/454

(56) References Cited

U.S. PATENT DOCUMENTS

| 5,327,439 A | * | 7/1994 | Estola et al. | 375/343 |
| 5,805,640 A | * | 9/1998 | O'Dea et al. | 332/103 |
| 5,818,813 A | * | 10/1998 | Saito et al. | 370/208 |
| 6,005,477 A | * | 12/1999 | Deck et al. | 340/310.01 |

OTHER PUBLICATIONS

Bingham, John A. C. Multicarrier Modulation for Data Transmission: An Idea Whose Time Has Come, May 1990, IEEE, Communications Magazine.*

Luo, Tao, Small Delay Multipath Diversity in Spread Spectrum Communication Systems,Jul. 2002, IEEE, Transactions on Communications, vol. 50, No. 7.*

V.K. Garg et al.: "Third Generation (3G) Mobile Communications systems Communications Proceedings" IEEE International Conference on Personal Wireless, Feb. 17, 1999, pp. 33\9–43, XP002118042 *p. 42, col. 1, line 51—col. 2, line 12*.

A. Baier et al.: "Design Study for a CDMA–Based Third–Generation Mobile Radio System" IEEE Journal on Selected Areas in Communications, vol. 12, No. 4, May, 1994, pp. 733–743, XP000572845 *p. 733, col. 1, line 1—p. 742, col. 2, line 2*.

A. Klein et al.: "Frames Multiple Access Mode 1—Wideband TDMA With and Without Spreading" IEEE International Symposium on Personal, Indoor and Mobile Radio Communications, Sep., 1998, pp 37–41, XP002005885, *p. 37, col. 1, line 1—p. 40, col. 2, last line*.

"Specifications of Air–Interface for 3G Mobile System" Association of Radio Industries and Business (ARIB), vol. 3, issued Dec. 18, 1997, revised Jul. 21, 1998. (See specification for discussion.).

* cited by examiner

*Primary Examiner*—Don N. Vo
(74) *Attorney, Agent, or Firm*—Dickstein, Shapiro, Morin & Oshinsky, LLP.

(57) ABSTRACT

A rate matching method allowing reliable digital communication is disclosed. After setting $D=|n-m|$ and $Q=n/D$, the input symbol string is sequentially divided to produce D symbol strings each consisting of either Q symbols or (Q+1) symbols so as to arrange the input symbols in an arrangement of columns (C) and rows (R). Then, after selecting a single symbol located at a predetermined position for each of the D symbol strings, the output symbol string is provided by deleting the single symbol for each of the D symbol strings when $n>m$ or repeating the single symbol for each of the D symbol strings when $n<m$.

13 Claims, 15 Drawing Sheets

| C / R | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | 3 | 8 | 13 | 17 | 22 | 26 | ... | 113 | 118 | 122 | 127 |
| 3 | 4 | 9 | 14 | 18 | 23 | 27 | ... | 114 | 119 | 123 | 128 |
| 4 | 5 | 10 |  | 19 |  | 28 | ... | 115 |  | 124 |  |

FIG. 6

[N=128→M=100, SYMBOL DELETION (q=2)]

| C<br>R | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | ~~3~~ | ~~8~~ | ~~13~~ | ~~17~~ | ~~22~~ | ~~26~~ | ... | ~~113~~ | ~~118~~ | ~~122~~ | ~~127~~ |
| 3 | 4 | 9 | 14 | 18 | 23 | 27 | ... | 114 | 119 | 123 | 128 |
| 4 | 5 | 10 | | 19 | | 28 | ... | 115 | | 124 | |

FIG. 7A (N=128→M=100, LAST SYMBOL DELETION FOR EACH COLUMN)

| R\C | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | 3 | 8 | 13 | 17 | 22 | 26 | ... | 113 | 118 | 122 | 127 |
| 3 | 4 | 9 | ~~14~~ | 18 | ~~23~~ | 27 | ... | 114 | ~~119~~ | 123 | ~~128~~ |
| 4 | ~~5~~ | ~~10~~ | | ~~19~~ | | ~~28~~ | ... | ~~115~~ | | ~~124~~ | |

FIG. 7B (N=128→M=100, LAST BUT TWO SYMBOL DELETION FOR EACH COLUMN)

| R\C | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | ~~12~~ | 16 | ~~21~~ | 25 | ... | 112 | ~~117~~ | 121 | ~~126~~ |
| 2 | ~~3~~ | ~~8~~ | 13 | ~~17~~ | 22 | ~~26~~ | ... | ~~113~~ | 118 | ~~122~~ | 127 |
| 3 | 4 | 9 | 14 | 18 | 23 | 27 | ... | 114 | 119 | 123 | 128 |
| 4 | 5 | 10 | | 19 | | 28 | ... | 115 | | 124 | |

FIG. 8

[N=128→M=156, SYMBOL REPETITION (q=2)]

| R \ C | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | 3 | 8 | 13 | 17 | 22 | 26 | ... | 113 | 118 | 122 | 127 |
|   | 3 | 8 | 13 | 17 | 22 | 26 | ... | 113 | 118 | 122 | 127 |
| 3 | 4 | 9 | 14 | 18 | 23 | 27 | ... | 114 | 119 | 123 | 128 |
| 4 | 5 | 10 |   | 19 |   | 28 | ... | 115 |   | 124 |   |

FIG. 9A (N=128→M=156, LAST SYMBOL REPETITION FOR EACH COLUMN)

| R\C | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | 3 | 8 | 13 | 17 | 22 | 26 | ... | 113 | 118 | 122 | 127 |
| 3 | 4 | 9 | 14 | 18 | 23 | 27 | ... | 114 | 119 | 123 | 128 |
| 4 | 5 | 10 | 14 | 19 | 23 | 28 | ... | 115 | 119 | 124 | 128 |
|   | 5 | 10 |   | 19 |   | 28 | ... | 115 |   | 124 |   |

FIG. 9B (N=128→M=156, LAST BUT TWO SYMBOL REPETITION FOR EACH COLUMN)

| R\C | 0 | 1 | 2 | 3 | 4 | 5 | ... | 24 | 25 | 26 | 27 |
|---|---|---|---|---|---|---|---|---|---|---|---|
| 0 | 1 | 6 | 11 | 15 | 20 | 24 | ... | 111 | 116 | 120 | 125 |
| 1 | 2 | 7 | 12 | 16 | 21 | 25 | ... | 112 | 117 | 121 | 126 |
| 2 | 3 | 8 | 12 | 17 | 21 | 26 | ... | 113 | 117 | 122 | 126 |
| 3 | 3 | 8 | 13 | 17 | 22 | 26 | ... | 113 | 118 | 122 | 127 |
| 4 | 4 | 9 | 14 | 18 | 23 | 27 | ... | 114 | 119 | 123 | 128 |
|   | 5 | 10 |   | 19 |   | 28 | ... | 115 |   | 124 |   |

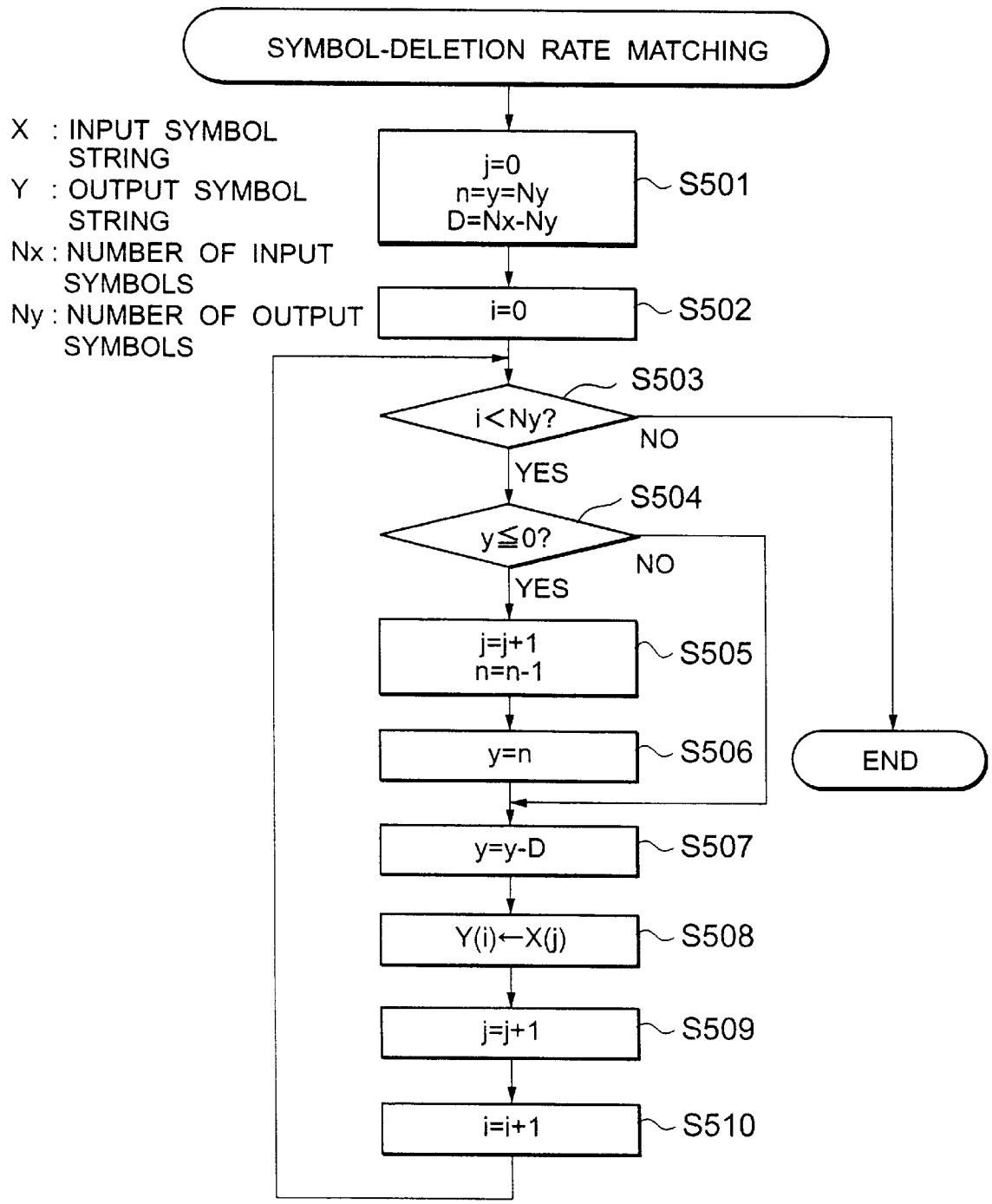

FIG. 11

```
int *puncture(Nx,Ny,X,Y)
   int Nx,Ny,*X,*Y ;
{
   int i,j,y,n,D ;

j=0 ;
   n=y=Ny ;
   D=Nx-Ny ; /*number of bits to be punctured*/ ;

for (i=0 ; i<Ny ; i++) {
      if(y<=0) {
         j++ ; /*skip reading of data to be punctured*/;
         n-- ;
         y=n ;
      }
      y-=D ;
      Y[i]=x[j] ;
      j++ ;
   }
   return(Y) ;
}
```

FIG. 13

```
int *repetition(Nx,Ny,X,Y)
   int Nx,Ny,*X,*Y ;
{
   int i,j,x,n,D ;

j=0 ;
   n=x=Nx ;
   D=Nx-Ny ; /*number of repetition bits */ ;

for (i=0 ; i<Ny ; i++) {
      if(x<=0) {
         j-- ; /*repeat data*/ ;
         n-- ;
         x=n ;
      } else {
      x- =D ;
      }
      Y[i]=x[j] ;
      j++ ;
   }
   return(Y) ;
}
```

| 1 | 6 | 11 | 16 | 21 | 26 | 31 | 36 | 41 | 46 | 51 | 56 | 61 | 66 | 71 | 76 | 81 | 85 | 89 | 93 | 97 | 101 | 105 | 109 | 113 | 117 | 121 | 125 |
|---|---|---|---|---|---|---|---|---|---|---|---|---|---|---|---|---|---|---|---|---|---|---|---|---|---|---|---|
| 2 | 7 | 12 | 17 | 22 | 27 | 32 | 37 | 42 | 47 | 52 | 57 | 62 | 67 | 72 | 77 | 82 | 86 | 90 | 94 | 98 | 102 | 106 | 110 | 114 | 118 | 122 | 126 |
| 3 | 8 | 13 | 18 | 23 | 28 | 33 | 38 | 43 | 48 | 53 | 58 | 63 | 68 | 73 | 78 | 83 | 87 | 91 | 95 | 99 | 103 | 107 | 111 | 115 | 119 | 123 | 127 |
| 4 | 9 | 14 | 19 | 24 | 29 | 34 | 39 | 44 | 49 | 54 | 59 | 64 | 69 | 74 | 79 | 84 | 88 | 92 | 96 | 100 | 104 | 108 | 112 | 116 | 120 | 124 | 128 |
| 5 | 10 | 15 | 20 | 25 | 30 | 35 | 40 | 45 | 50 | 55 | 60 | 65 | 70 | 75 | 80 | | | | | | | | | | | | |

S1 = (strikethroughs shown as ~~x~~)

| 1 | 6 | 11 | 16 | 21 | 26 | 31 | 36 | 41 | 46 | 51 | 56 | 61 | 66 | 71 | 76 | 81 | 85 | 89 | 93 | 97 | 101 | 105 | 109 | 113 | 117 | 121 | 125 |
|---|---|---|---|---|---|---|---|---|---|---|---|---|---|---|---|---|---|---|---|---|---|---|---|---|---|---|---|
| 2 | 7 | 12 | 17 | 22 | 27 | 32 | 37 | 42 | 47 | 52 | 57 | 62 | 67 | 72 | 77 | 82 | 86 | 90 | 94 | 98 | 102 | 106 | 110 | 114 | 118 | 122 | 126 |
| 3 | 8 | 13 | 18 | 23 | 28 | 33 | 38 | 43 | 48 | 53 | 58 | 63 | 68 | 73 | 78 | 83 | 87 | 91 | 95 | 99 | 103 | 107 | 111 | 115 | 119 | 123 | 127 |
| 4 | 9 | 14 | 19 | 24 | 29 | 34 | 39 | 44 | 49 | 54 | 59 | 64 | 69 | 74 | 79 | ~~84~~ | ~~88~~ | ~~92~~ | ~~96~~ | ~~100~~ | ~~104~~ | ~~108~~ | ~~112~~ | ~~116~~ | ~~120~~ | ~~124~~ | ~~128~~ |
| ~~5~~ | ~~10~~ | ~~15~~ | ~~20~~ | ~~25~~ | ~~30~~ | ~~35~~ | ~~40~~ | ~~45~~ | ~~50~~ | ~~55~~ | ~~60~~ | ~~65~~ | ~~70~~ | ~~75~~ | ~~80~~ | | | | | | | | | | | | |

FIG. 14B

S1 = (underlined entries shown as __x__)

| 1 | 6 | 11 | 16 | 21 | 26 | 31 | 36 | 41 | 46 | 51 | 56 | 61 | 66 | 71 | 76 | 81 | 85 | 89 | 93 | 97 | 101 | 105 | 109 | 113 | 117 | 121 | 125 |
|---|---|---|---|---|---|---|---|---|---|---|---|---|---|---|---|---|---|---|---|---|---|---|---|---|---|---|---|
| 2 | 7 | 12 | 17 | 22 | 27 | 32 | 37 | 42 | 47 | 52 | 57 | 62 | 67 | 72 | 77 | 82 | 86 | 90 | 94 | 98 | 102 | 106 | 110 | 114 | 118 | 122 | 126 |
| 3 | 8 | 13 | 18 | 23 | 28 | 33 | 38 | 43 | 48 | 53 | 58 | 63 | 68 | 73 | 78 | 83 | 87 | 91 | 95 | 99 | 103 | 107 | 111 | 115 | 119 | 123 | 127 |
| 4 | 9 | 14 | 19 | 24 | 29 | 34 | 39 | 44 | 49 | 54 | 59 | 64 | 69 | 74 | 79 | __84__ | __88__ | __92__ | __96__ | __100__ | __104__ | __108__ | __112__ | __116__ | __120__ | __124__ | __128__ |
| 5 | __10__ | __15__ | __20__ | __25__ | __30__ | __35__ | __40__ | __45__ | __50__ | __55__ | __60__ | __65__ | __70__ | __75__ | __80__ | | | | | | | | | | | | |
| __5__ | | | | | | | | | | | | | | | | | | | | | | | | | | | |

RATE MATCHING METHOD

BACKGROUND OF THE INVENTION

1. Field of the Invention

The present invention generally relates to a digital communication system, and in particular to a rate matching method for producing an output string of m symbols from an input string of n (n−m) symbols

2. Description of the Related Art

In the field of digital communication systems, there have been proposed several rate matching methods for obtaining output sequence of m symbols from input sequence of n symbols. In the case of n>m, the first (n−m) symbols of the input symbol string are deleted to produce the output string of the remaining m symbols. In the case of n<m, after repeating a top input symbol (m−n+1) times, m symbols following the top input symbol are output to produce the output string of m symbol.

In the case of the symbol sequence encoded with a convolution code, it is known that the original information can be reproduced correctly, even if the symbol sequence has been partly deleted, by inserting dummy symbols into the imperfect symbol sequence at the positions corresponding to the deleted symbols when decoded. Such error-correction decoding is allowed by the coding gain achieved by a convolution code.

In general, many decoding systems are susceptible to an error burst, and when a number of symbols have been consecutively deleted as mentioned above, they cannot fully exhibit the error correction capability.

On the other hand, in the case where the same symbol is consecutively repeated, the energy of the repeated symbol becomes large in equivalent by using the energy of the repeated symbol effectively. This may allow error rate to be effectively reduced around the repeated symbol. In the case of the convolution code, however, the reduction in error rate for symbols more than the constraint length away from that symbol cannot be expected at all.

To solve these problems to some extent, there has been proposed a rate matching method conforming to IMT-2000 scheme, which is now under standardization by ARIB (Association of Radio Industries and Businesses). The details of this method are described in "Volume 3, Specification of Air-Interface for the 3G Mobile System Version 0.5". Hereafter, this specification will be described briefly.

Assuming that an input symbol sequence is denoted by S0 the number of input symbols thereof by n, and the number of output, symbol of an output symbol sequence by m, a symbol-deletion rate matching method (n>m) is performed according to the following algorithm:

(a) j=0, x=n, and y=n−m;
(b) go to step (c) when y is equal to greater than 1, and exit otherwise with the current symbol sequence S being an output sequence;
(c) set z to a minimum integer which is not smaller than x/y;
(d) set k to a maximum integer which is not greater than x/z;
(e) delete a symbol every z symbols from the symbol sequence $S_j$ and the resultant symbol sequence is denoted by $S_{j,1}$;
(f) x=x−k, y=y−k, and j=j+1; and
(g) go back to step (b).

A symbol-repetition rate matching method (n<m) is performed according to tho following algorithm:

(A) j=0;
(B) go to step (C) when 2n is smaller than m, and go to step (F) otherwise;
(C) repeat all symbols of $S_j$ one time and the resultant is denoted by $S_{j+1}$;
(D) n=2n, and j=j+1,
(E) go back to step (B);
(F) x=n, and y=m−n;
(G) go to step (H) when y exceeds 1, and go to step (M) otherwise;
(H) set z to a minimum integer which is not smaller than x/y;
(I) set k to a maximum integer which Is not greater than x/z;
(J) repeat $S_j$ every z symbols unless it has been already repeated, and the resultant symbol sequence is denoted by $S_{j+1}$;
(K) x=x−k, y=y−k, and j=j+1;
(L) go back to step (J); and
(M) when y=1, repeat only the first symbol of $S_j$ and the resultant symbol sequence is denoted by $S_{j+1}$ before exit, and when y in not equal to 1, exit with the current symbol sequence S being an output sequence.

FIG. 15 shows concrete operations of a conventional symbol-deletion rate matching method conforming to the IMT-2000 scheme. Here, it is assumed that the number of input symbols is 128 (n=128) and the number of output symbols is 100 (m=100).

As shown in FIG. 15A, symbol sequence S0 of n=128 is inputted. According to the symbol-deletion rate matching algorithm, the steps (a)–(e) provide x=128, y=28, z=5, and k=25, resulting in a symbol sequence S1 as shown in FIG. 15B.

This symbol sequence S1 is obtained by deleting S0 every five symbols.

When the steps (a)–(e) are performed for a second time, x =x−k=103, y=y−k=3, z=35, and k=2 are obtained. Therefore the symbol sequence S1 is deleted every 35 symbols, resulting in a symbol sequence S2 as shown in FIG. 15C.

When the steps (a)–(e) are performed for a third time, X=101, y=1, z=101, and k=1 are obtained. Therefore, the symbol sequence S2 is deleted every 101 symbols that is only the last symbol is deleted, resulting in the final symbol sequence S3 as shown in FIG. 15D. Therefore, in this example the input symbol sequence of 128 symbols is converted into the output symbol sequence of 100 symbols by three-time symbol deletion operation.

It will be understood from the example shown in FIGS. 15A–15D that each deleting operation (steps (a)–(e)) provides the maximum interval between deleted symbols, resulting in optimum deletion processing, but the optimum deletion processing is not always performed between deleting operations because the relation between the current and the previous deleting operations is not sufficiently taken into account.

More specifically, since the interval between deleted symbols have been maximized in the previous deleting operation, the current deleting operation can provide a symbol-deletion interval equal to or smaller than that of the previous deleting operation (in most cases, a half or less the symbol-deletion interval achieved by the previous deleting operation).

As shown in FIG. 15B, the 45th symbol of the symbol sequence S1 is deleted. Subsequently, the 43rd symbol is deleted as shown in FIG. 15C. Similarly, the 85th and 87th symbols are deleted. In this case, the distance between deleted symbols is only two symbols.

As described above, according to the conventional algorithm, symbol deletion may be performed at a plurality of consecutive positions depending on the relation between the numbers of input and output symbols. There is a high possibility that the symbol sequence deleted like this causes problems when demodulated and decoded.

Similarly, in the case of symbol-repetition rate matching, the positions of repeated symbols may be distributed unevenly, producing a symbol region susceptible to error and a symbol region resistant to error.

SUMMARY OF THE INVENTION

An object of the present invention is to provide a rate matching method that can achieve more reliable data communication.

According to the present invention, a rate matching method produces m output symbols from n ($n \neq m$) input symbols by a selected one of symbol deletion and symbol repetition depending on a comparison result of n and m, where n and m are an integer greater than 0. The method comprises the step of maximizing a smallest interval between symbols subjected to the selected one of the symbol deletion and the symbol repetition and the step of maximizing a sum total of intervals of symbols subjected to the selected one of the symbol deletion and the symbol repetition.

An interval of symbols subjected to the selected one of the symbol deletion and the symbol repetition may be one of k and k−1, where k is an integer greater than 0.

According to the present invention, a rate matching method for inputting a first symbol string S(k) of n symbols and outputting a second symbol string d(j) of m ($n \neq m$) symbols in a digital communication system, where n and m are an integer greater than 0, k is an integer ranging from 0 to n−1, and j is an integer ranging from 0 to m−1, comprises the steps of: a) setting a difference (D) between n and m; b) setting Q=n/D; c) sequentially dividing the first symbol string S(k) to produce D symbol strings each consisting of either Q symbols or (Q+1) symbols: d) selecting a single symbol located at a predetermined position for each of the D symbol strings; and e) producing the second symbol string d(j) by performing one of deletion and repetition of the single symbol for each of the D symbol strings depending on a comparison result of n and m.

The first symbol string S(k) is preferably included in encoded symbol sequence produced with an error-correction code such as a convolution code.

Preferably, the second symbol string d(j) is interleaved and then transmitted and the first symbol string S(k) is produced by deinterleaving a received symbol string.

Further preferably, the step (c) includes the step of determining a position (R,C) of each element of an arrangement to sequentially arrange the first symbol string S(k), wherein C and R are determined as follows:

$$C=INT(k \times D/n);$$

and $$R=INT(k-C \times n/D),$$

where INT(x) is a function of obtaining an integer part of x.

As described above according to the present invention, the narrowest interval and the widest interval between deleted or repeated symbols are almost the same. In other words, the narrowest interval is maximized, resulting in the maximized sum total of intervals of deleted or repeated symbols. In addition, the positions of deleted or repeated symbols are spread out uniformly over the input symbol string. Therefore, reliable and stable digital communication can be achieved.

BRIEF DESCRIPTION OF THE DRAWINGS

FIG. 5 is a schematic diagram showing the calculation of R and C in form of lable in the case where N=128 and the difference in number between input and output symbols is 28;

FIG. 6 is a schematic diagram showing an example of a symbol-deletion rate matching method from N=128 to M=100 in the case of q=2;

FIG. 7A is a schematic diagram showing an example of a rate matching method for deleting the last symbol for each column (p–0);

FIG. 7B is a schematic diagram showing an example of a rate matching method for deleting the last but two symbol for each column (p=0);

FIG. 8 is a schematic diagram showing an example of a symbol-repetition rate matching method from N=128 to M=156 in the case of q=2;

FIG. 9A is a schematic diagram showing an example of a rate matching method for repeating the last symbol for each column (p=0);

FIG. 9B is a schematic diagram showing an example of a rate matching method for repeating the last but two symbol for each column (p=0);

FIG. 10 is a flowchart showing an example of a symbol-deletion rate matching method according to a third embodiment of the present invention;

FIG. 11 is a diagram showing a program of the procedure of FIG. 10 using C programming language;

FIG. 13 is a diagram showing a program of the procedure of FIG. 12 using C programming language;

FIG. 14A is a diagram showing an example of an arrangement of input symbol sequence obtained by the algorithm as shown in FIG. 10;

FIG. 14B is a diagram showing an example of an arrangement of input symbol sequence obtained by the algorithm as shown in FIG. 12; and FIGS. 15A–15D are diagrams showing a concrete sequence of operations of a conventional symbol-deletion rate matching method conforming to the IMT-200 scheme.

DETAILED DESCRIPTION OF THE PREFERRED EMBODIMENTS

Figure 1:
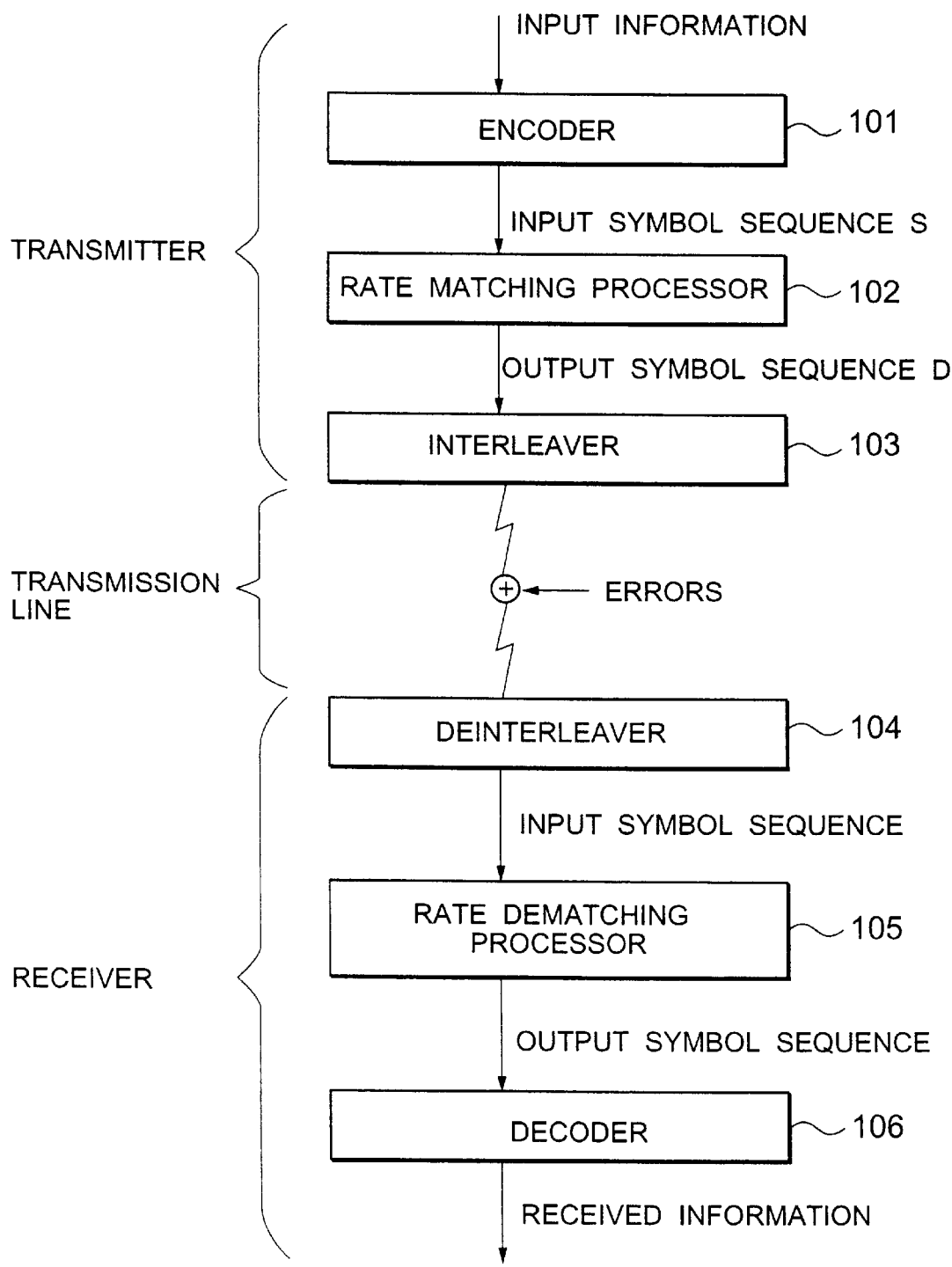
FIG. 1 is a schematic diagram showing a digital communication system employing a rate matching method according to the present invention.

It is assumed for simplicity that a digital communication system is composed of a transmitter, a transmission line, and a receiver. The transmitter includes an encoder 101, a rate matching processor 102, and an interleaver 103. The receiver includes a deinterleaver 104, a rate dematching processor 105, and a decoder 106.

In the transmitter, the encoder 101 encodes the input information to output an input symbol sequence S to the rate matching processor 102 which implements the rate matching method according to the present invention. The encoder 101 employs error-correction coding scheme such as convolutional codes or Turbo codes, which can provide the original information with redundancy to allow error correction to some extent when decoded at a receiving side.

The rate matching processor 102 inputs the input symbol sequence S in units of N symbols and outputs an output symbol sequence D in units of M symbols to the interleaver 103. In other words, the rate matching processor 102 changes N symbols into M symbols for rate matching.

The output symbol sequence D is interleaved by the interleaver 103 and then, based on the interleaved symbol sequence, a transmission signal is generated and output to the transmission line. If a burst of errors occurs on the transmission line, resulting in deteriorated transmission signal of a decoder of the burst, then the error-correction capability of a decoder of the receiver is remarkably reduced. To spread out such error bursts in time, the system employs interleaving. More specifically, the output symbol sequence D is recorded by the interleaver 103 and transmitted over the transmission line. Here, the interleaving is performed in units of an integral multiple of M.

At the receiver, after demodulation, the deinterleaver 104 puts the received data in proper sequence to output the received symbol sequence to the rate dematching processor 105 according to the present invention. The rate dematching processor 105 inputs the symbol sequence in units of M symbols to output symbol sequence in units of N symbols. In other words, the rate dematching processor 105 changes M symbols into N symbols. The output symbol sequence is decoded to produce received information by the decoder 106.

The rate matching method according to the present invention is applied to the rate matching processor 102 and the rate dematching processor 105 in FIG. 1. According to the present invention, as described later, the positions of deleted/repeated symbols are spread out uniformly. Therefore, a combination of the interleaving and the rate matching allows more reliable data communication.

Figure 2:
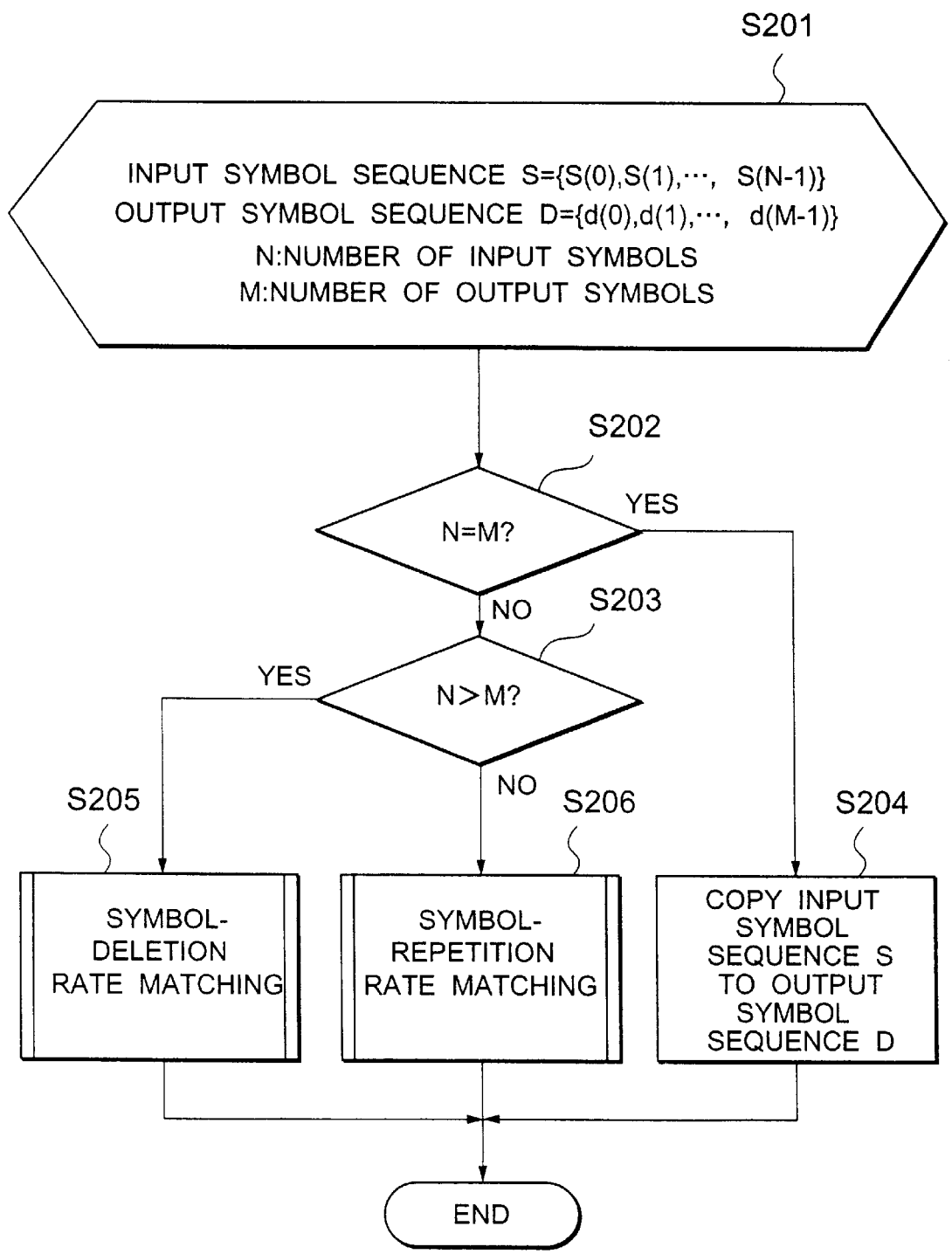
FIG. 2 is a flow chart showing an outline of the rate matching method according to the present invention.

Referring to FIG. 2, as shown by step S201, input symbol string S of N symbols is denoted by S={S(0), S(1), ..., S(N−1)} and output symbol string D of M symbols is denoted by D={d(0), d(1), ..., d(M−1)}. Hereinafter, the case where the rate matching is performed from N to M will be described.

First, the input symbol count N is compared to the output symbol count M (steps S202 and S203). If they are identical (YES in step S202), then the output symbol string is copied from the input symbol string as it is because the rate matching is not needed (step S204).

If N>M (YES in step S203), then it is necessary to delete (N−M) symbols from the input symbol string and therefore symbol-deletion rate matching is performed (step S205). Contrarily, if N<M (NO is step S203), then it is necessary to add (M−N) symbols to the input symbol string and therefore symbol-repetition rate matching is performed (step S206).

Symbol-Deletion Rate Matching (1)

Figure 3:
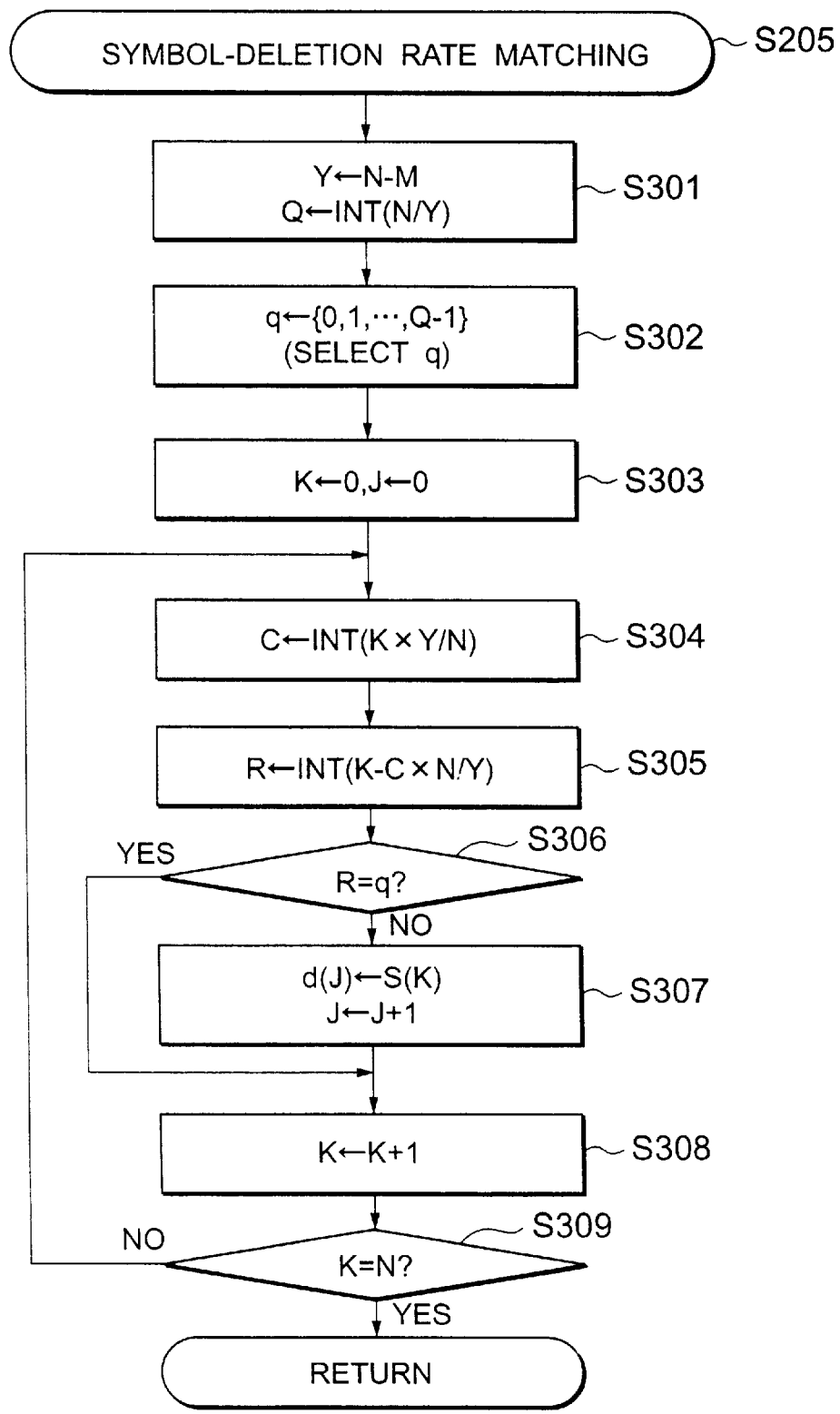
FIG. 3 is a flowchart showing an example of a symbol-deletion rate matching method according to a first embodiment of the present invention.

Referring to FIG. 3, (N−M) symbols are deleted from the input symbol string as described hereinafter.

First, Y is set to N−M and Q is set to the integer part of N/Y, which is denoted by INT(N/Y) (step S301). Subsequently, q is set to a selected one of {0, 1, 2, ..., Q−1} according to a predetermined way (step S302). For example, q may be fixed to 0. Thereafter, K and J are initialized to 0, where K is an index of the input symbol string and J is an index of the output symbol string (step S303).

Next, C is set to INT(K×Y/N) and R is set to INT(K−C× N/Y) (steps S304 and S305), where C and R may denote columns and rows of an arrangement accommodating the input symbols.

Subsequently, R is compared to q (step S306). If R is not identical to q (NO in step S306), then an input symbol S(K) is copied to an output symbol d(J) and then J is incremented (step S307) before K is incremented (stop S308) If R=q (YES in step S306), then K is incremented without performing the step S307 (step S308). Thereafter, K is compared to N (step S309) and, if K=N, then this routine is ended. If K is not identical to N (NO In step S309), control goes back to the step S304. The processing of the steps S304 through S309 is repeatedly performed until K has reached N.

Symbol-repetition Rate Matching (1)

Figure 4:
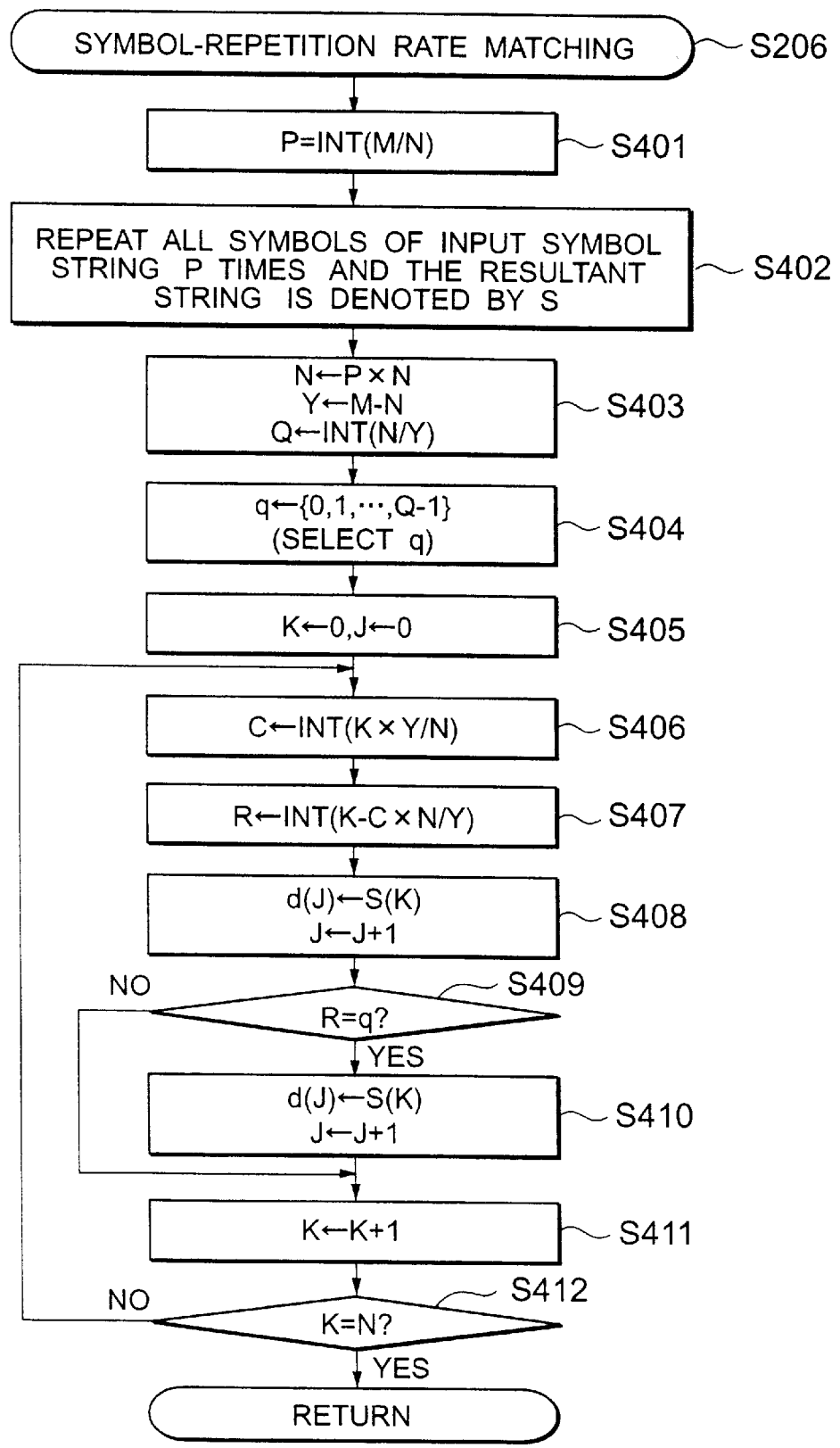
FIG. 4 is a flowchart showing an example of a symbol-repetition rate matching method according to a second embodiment of the present invention.

Referring to FIG. 4, (M−N) symbols are added to the input symbol sequence as described hereinafter.

First, P is set to the integer part of M/N, which is denoted by INT(M/N) (step S401). Subsequently, all symbols of the input symbol string S are repeated P times and the resultant symbol string is denoted by S (step S402). For example, in the case of P=2, each symbol of the input symbol string {S(0), S(1), ..., S(N 1)}] is repeated twice to produce a new symbol string (S(0), S(0), S(1), S(1), ..., S(N−1), S(N−1)}, which is called an input symbol sequence S.

Subsequently, N is set to P×N. Y is set to M−N, and Q is set to INT(N/Y) (step S403). Thereafter, q is set to a selected one of (0, 1, 2, ..., Q−1) according to a predetermined way (step S404). For example, q may be fixed to 0. Then, K and J are initialized to 0, where K is an index of the input symbol string and J is an index of the output symbol string (step S405).

Next, C is set to INT(K×Y/N) and R is set to INT(K−C× N/Y) (steps S406 and S407), and then an input symbol S(K) is copied to an output symbol d(J) and then J is incremented (step S408). Subsequently, R is compared to q (step S409) and, if R is identical to q (YES in step S409), then the input symbol S(K) is further copied to tho output symbol d(J) and then J is incremented (step S410) before K is incremented (step S411). It R is not identical to q (NO in step S409), then K is incremented without performing the step S410 (step S411). Thereafter, K is compared to N (step S412) and, if K=N, then this routine is ended. If K is not identical to N (NO in step S412), control goes back to the step S406. The processing of the steps S406 through S412 is repeatedly performed until K has reached N.

EXAMPLE (1)

The following examples are obtained by actually performing the symbol-deletion rate matching and the symbol-repetition rate matching.

Arrangement Obtained by R and C

As shown in FIG. 5, in the cage of N=128 and |N−M|=28, R and C correspond to a row and a column of an arrangement, respectively. The 128 input symbols {1, 2, 3, ..., 127, 128} are sequentially arranged in order of (C,R)=(0,0), (0,1), (0,2), (0,3), (0,4), (1,0), (1,1), (1,2), ..., (27,0), (27,1), (27,2), (27,3), (27,4), where R and C are calculated as described above.

Example 1-1

Symbol Deletion

Referring to FIG. 6, in the case of q=2, N=128 and M=100, the step S307 is performed when R is not identical to 2 and, only when R=2, the step S307 is skipped. In other words, as shown in FIG. 6, the 28 symbols included in the row of R=2 are not copied, resulting in the output symbol string D={1, 2, 4, 5, 6, 7, 9, 10, 11, 12, 14, 15, ..., 125, 126, 128}. The symbols of any row can be deleted by selecting the corresponding value of q.

Example 1-2

Symbol Deletion

Another way may be used to delete N−M symbols. The same advantage can be obtained by determining the distance of a symbol from the bottom symbol for each column. More specifically, the distance (p) of a symbol from the bottom symbol is selected from {0, 1, 2, 3}. Thereafter, by comparing R and p for earn C, it is determined whether the corresponding symbol should be copied, in other words, the step S307 of FIG. 3 should be skipped.

Referring to FIG. 7A, in the case of p=0, the respective last symbols of the columns {5, 10, 14, 19, 23, 28, ..., 115, 119, 124, 128} are deleted from the input symbol string S.

Referring to FIG. 7B, in the case of p=2, the respective last-but-two symbols of the columns {3, 8, 12, 17, 21, 26, ..., 113, 117, 122, 126} are deleted from the input symbol string S.

As described above, according to the present embodiment, the narrowest interval and the widest interval between deleted symbols are almost the same. Precisely, the narrowest interval is shorter than the widest interval by only one symbol. As shown in FIGS. 6 and 7, the narrowest interval is 4 symbols and the widest interval is 5 symbols. In other words, the narrowest interval is maximized, resulting in the maximized sum total of intervals of deleted symbols. In addition, the positions of deleted symbols are spread out uniformly over the input symbol string.

Example 1-3

Symbol Repetition

Referring to FIG. 8, in the case of q=2, N=128 and M=156, the step S410 is performed only when R is identical to 2 and, when R is not identical to 2, the step S410 is skipped. In other words, as shown in FIG. 8, only the 28 symbols included in the row of R=2 are copied, resulting in the output symbol string D={1, 2, 3, 3, 4, 5, 6, 7, 8, 8, 9, 10, 11, 12, 13, 13, 14, 15, ..., 125, 126, 127, 127, 128}. The symbols of any row can be repeated by selecting the corresponding value of q.

Example 1-4

Symbol Repetition

Another way may be used to repeat N−M symbols. The same advantage can be obtained by determining the distance of a symbol from the bottom symbol for each column. More specifically, the distance (p) of a symbol from the bottom symbol is selected from {0, 1, 2, 3}. Thereafter, by comparing R and p for each C, it is determined whether the corresponding symbol should be copied twice, in other words, the step S410 of FIG. 4 should be performed.

Referring to FIG. 9A, in the case of p=0, the respective last symbols of the columns {5, 10, 14, 19, 23, 28, ..., 119, 124, 128} are repeated.

Referring to FIG. 9A, in the case of p=2, the respective last-but-two symbols of the columns {3, 8, 12, 17, 21, 26, 113, 117, 122, 126} are repeated.

As described above, according to the present embodiment, the narrowest interval and the widest interval between deleted symbols are almost the dame. Precisely, the narrowest interval is shorter than the widest interval by only one symbol. As shown in FIGS. 8 and 9, the narrowest interval is 4 symbols and the widest interval is 5 symbols. In other words, the narrowest interval is maximized, resulting in the maximized sum total of intervals of deleted symbols. In addition, the positions of repeated symbols are spread out uniformly over the input symbol string.

Symbol-Deletion Rate Matching (2)

Referring to FIG. 10, X is an input symbol string, Y is an output symbol string. Nx is the number of input symbols, and Ny is the number of output symbols. Hereinafter, the case where the symbol-deletion rate matching from Nx to Ny is performed will be described.

First, a variable j is initialized to 0, variables n and y are initialized to Ny, and D is set to Nx-Ny (step S501). After initializing a variable i to 0 (step S502), it is determined whether the variable i is smaller than Ny (step S503).

If the variable i is smaller than Ny (YES in step S503), then it is further determined whether y is not greater than 0 (step S504). If y is equal to or smaller than 0 (YES in step S504), then j is incremented by one, n is decremented by one (step S505), and then y is set to the decremented n (step S506) before y is set to y D (step S507). If y>0 (NO in step S504), then y is set to y-D (step S507) without performing the steps S505 and S506. The increment of j in the step S505 provides symbol deletion.

Subsequently, an input symbol X(j) is copied to an output symbol Y(i) (Step S508) and thereafter j and i are incremented by one (steps S509 and 510) and then control goes back to the step S503. The processing of the steps S503 through S510 is repeatedly performed until the variable i has reached Ny.

FIG. 11 shows a program described with C language, corresponding to the procedure of FIG. 10. It should be noted that X is a pointer for the input symbol string and Y is a pointer for the output symbol string.

Symbol-Repetition Rate Matching (2)

Figure 12:
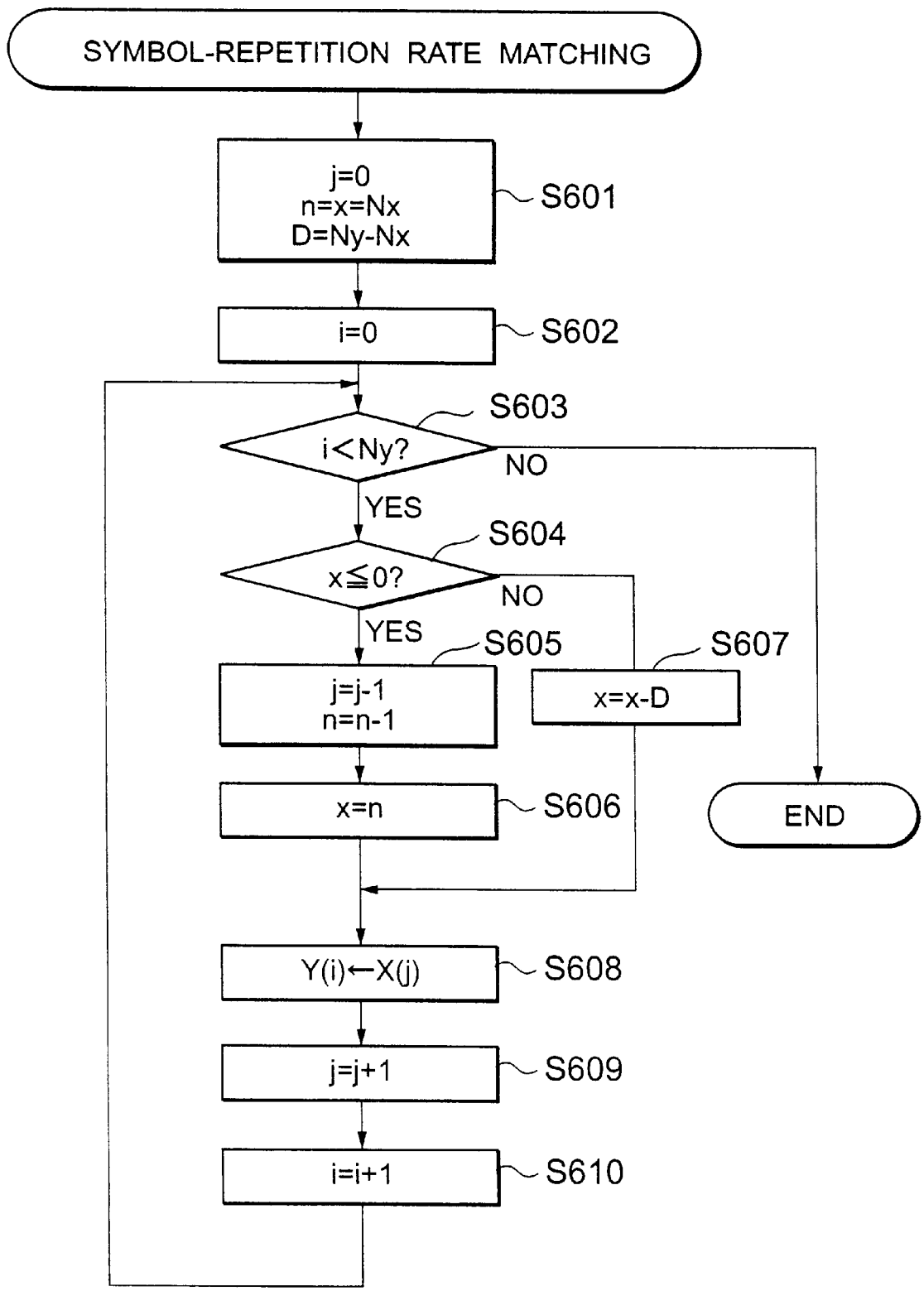
FIG. 12 is a flowchart showing an example of a symbol-deletion rate matching method according to a fourth embodiment of the present invention.

Referring to FIG. 12, X is an input symbol string, Y is an output symbol string, Nx is the number of input symbols, and Ny is the number of output symbols. Hereinafter, the case where the symbol-repetition rate matching from Ny to Nx is performed will be described.

First, a variable j is initialized to 0, variables n and x are initialized to Nx, and D is set to Ny-Nx (step S601). After initializing a variable i to 0 (step S602), it is determined whether the variable i is smaller than Ny (step S603).

If the variable i is smaller than Ny (YES in step S603), then it is further determined whether x is not greater than 0 (step S604). If x is equal to or smaller than 0 (YES In step S604), then j and n are both decremented by one (step S605) and then x is set to the decremented n (step 5606) before an input symbol X(j) is copied to an output symbol Y(1) (step S608). It x>0 (NO in step S604), then x is set to x-D (step S607) before an input symbol X(j) is copied to an output symbol Y(i) (step S608) without performing the steps S605 and S606. The decrement of j in the step S605 provides symbol repetition.

After an input symbol X(i) is copied to an output symbol Y(i) (step S608), j and i are incremented by one (steps S609 and S610) and then control goes back to the step S603. The processing of the steps S603 through S610 is repeatedly performed until the variable i has reached Ny.

FIG. 13 shows a program described with C language, corresponding to the procedure of FIG. 12. It should be noted that X is a pointer for the input symbol string and x is a pointer for the output symbol string.

Examples (2)

The following examples are obtained by actually performing the symbol-deletion rate matching of FIG. 10 and the symbol-repetition rate matching of FIG. 12.

Figures 15A, 15B, 15C, 15D:
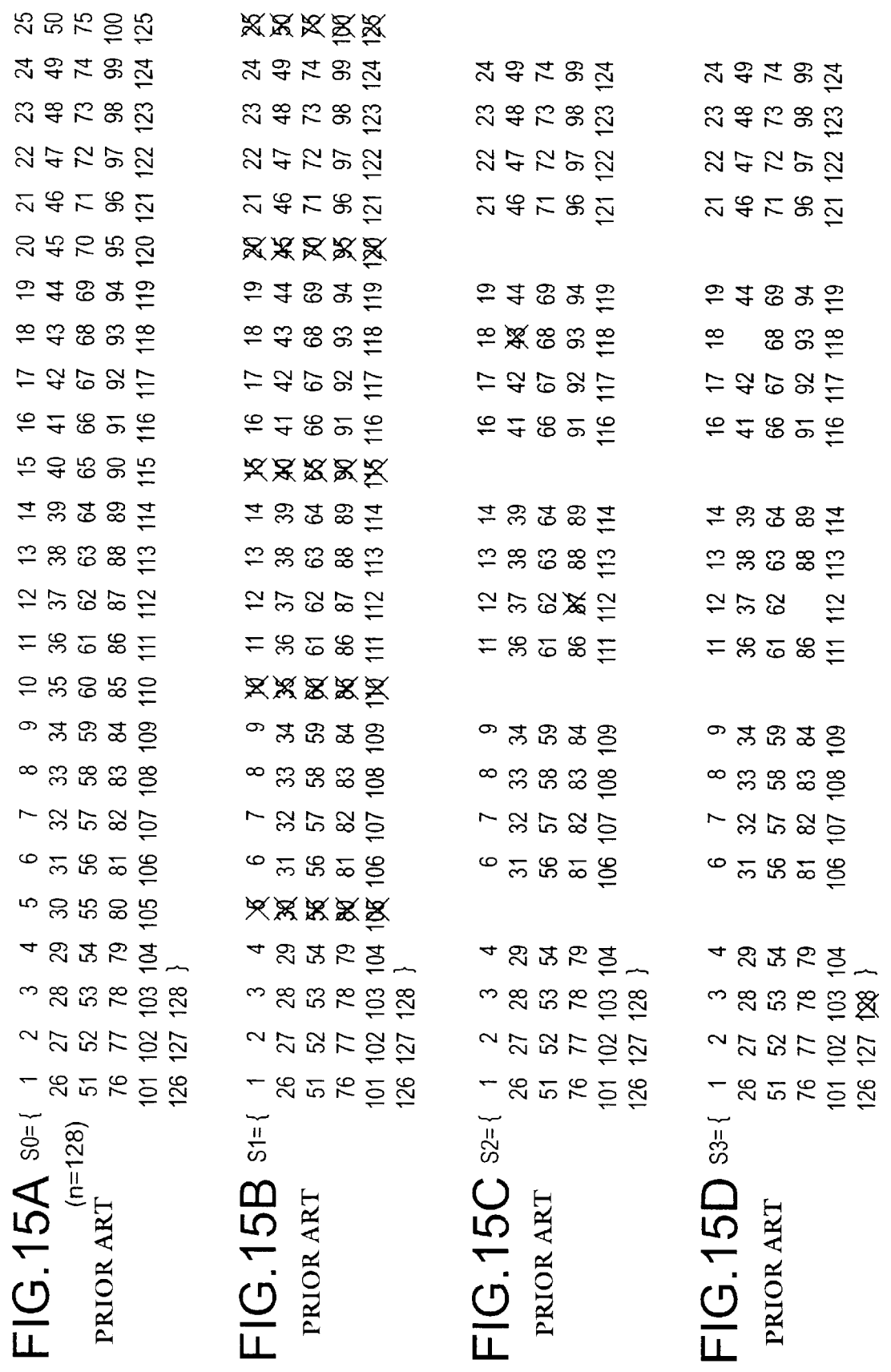

FIG. 14A shows the rate matching from the input symbol string S0 of 128 symbols to the output symbol string of 100 symbols, wherein the input symbol string S0 is {1, 2, 3, ..., 128}. In order to explain the operation of this embodiment, it is convenient to consider that the input symbol string is arranged in an arrangement of 28 (=128−100) columns×5 or 4 rows. According to the present embodiment. 28 symbols are deleted by deleting the last symbol for each column, resulting in the output symbol string S1 of 100 symbols. In this case, the minimum interval between deleted symbols is 4, which is greater than that of the prior art as shown in FIG. 15. It is apparent that the same effect is obtained by deleting any row (for example, the first row: 1, 6, 11, ..., 125) in FIG. 14A.

FIG. 14B shows the rate matching from the input symbol string S0 of 128 symbols to the output symbol string of 156 symbols, wherein the input symbol string S0 is {1, 2, 3, ..., 128} as shown in FIG. 14A. In order to explain the operation of this embodiment, it is convenient to consider that the input symbol string is arranged in an arrangement of 28 (=128−100) columns×5 or 4 rows. According to the present embodiment, 28 symbols are added to the input symbol string by repeating the last symbol for each column, resulting in the output symbol string S1 of 156 symbols. In this case, the minimum interval between repeated symbols is 4. It is apparent that the same effect is obtained by repeating any roe (for example, the first row: 1, 6, 11, ..., 125) in FIG. 14B.

In the above embodiment, the case where twice the number of input symbols is greater than the number of output symbols is described. In the case where twice the number of input symbols is smaller than the number of output symbols, all the symbols of the input symbol string are repeated once as in the conventional case, and then the resultant symbol string is treated as an input symbol string of the present embodiment. In this manner, the present invention can be applied to any case.

What is claimed is:

1. A rate matching method for inputting a first symbol string S(k) of n symbols and outputting a second symbol string d(j) of m (n≠m) symbols in a digital communication system, where n and m are an integer greater than 0, k is an integer ranging from 0 to n−1, and j is an integer ranging from 0 to m−1, comprising the steps of:

a) setting a difference (D) between n and m;

b) setting Q=n/D;

c) sequentially dividing the first symbol string S(k) to produce D symbol strings each comprising either Q symbols or (Q+1) symbols;

d) selecting a single symbol located at a predetermined position for each of the D symbol strings; and e) producing the second symbol string d(j) by performing one of deletion and repetition of the single symbol for each of the D symbol strings depending on a comparison result of n and m.

2. The rate matching method according to claim 1, wherein the first symbol string S(k) is included in an encoded symbol sequence produced with an error-correction code.

3. The rate matching method according to claim 2, wherein the error-correction code is a convolution code.

4. The rate matching method according to claim 1, wherein the second symbol string d(j) is interleaved and then transmitted.

5. The rate matching method according to claim 1, wherein the first symbol string S(k) is produced by deinterleaving a received symbol string which has been interleaved at a transmission side.

6. The rate matching method according to claim 1, wherein the step (c) includes the step of:

determining a position (R,C) of each element of an arrangement of sequentially arrange the first symbol string S(k), wherein C and R are determined as follows:

$$C=INT(k \times D/n);$$

and $$R=INT(k-C \times n/D),$$

where INT(x) is a function for obtaining an integer part or x.

7. The rate matching method according to claim 1, wherein, in the step (d), the single symbol is selected by comparing R and a value representing the predetermined position.

8. The rate matching method according to claim 1, wherein, in the step (d), the predetermined position indicates a last symbol for each of the D symbol strings.

9. The rate matching method according to claim 1, wherein, the step (d), the predetermined position indicates a symbol at a predetermined distance from a head symbol for each of the D symbol strings.

10. The rate matching method according to claim 1, wherein in the step (d), the predetermined position indicates a symbol at a predetermined distance from a last symbol for each of the D symbol strings.

11. A digital communication system for transmitting original digital information from a transmitter to a receiver through a transmission line, the transmitter comprising:

an encoder which encoder transmission information with an error-correction code to produce a first symbol sequence including a first symbol string of n symbols; and a rate matching processor which produces a second symbol sequence including a second symbol string of m (n≠m) symbols from the first symbol sequence, wherein the rate matching processor sets a difference (D) between n and m, sets Q=n/D, sequentially divides the first symbol string to produce D symbol strings each comprising either Q symbols or (Q+1) symbols, selects a single symbol located at a predetermined position for each of the D symbol strings, and producing the second symbol string by performing one of deletion and repetition of the single symbol for each of the D symbol strings depending on a comparison result of n and m, and the receiver comprising:

a rate dematching processor which receives the second symbol string from the transmitter and produces a third symbol sequence including a third symbol string of n symbols, wherein the rate dematching processor sequentially divides the second symbol string to produce D symbol strings each comprising either Q symbols or (Q+1) symbols, selects a single symbol located at a predetermined position for each of the D symbol strings, and producing the third symbol string by performing one of deletion and repetition of the single symbol for each of the D symbol strings depending on a comparison result of n and m; and a decoder which decodes the symbol sequence with the error-correction code to reproduce the original digital information.

12. The digital communication system according to claim 11, wherein:

the transmitter further comprises an interleaver which interleaves the second symbol sequence to produce a transmission symbol sequence, and the receiver further comprises a deinterleaver which deinterleaves the transmission symbol sequence.

13. A medium storing a rate matching program for inputting a first symbol string S(k) of n symbols and outputting a second symbol string d(j) of m (n≠m) symbols in a digital communication system, where n and m are an integer greater than 0, k is an integer ranging from 0 to n−1, and j is an integer ranging from 0 to m−1, the program comprising the steps of:

a) setting a difference (D) between n and m;

b) setting Q=n/D;

c) sequentially dividing the first symbol string S(k) to produce D symbol strings each comprising either Q symbols or (Q+1) symbols;

d) selecting a single symbol located at a predetermined position for each of the D symbol strings; and e) producing the second symbol string d(j) by performing one of deletion and repetition of the single symbol for each of the D symbol strings depending on a comparison result of n and m.

\* \* \* \* \*